(12) United States Patent
Wang

(10) Patent No.: US 10,877,339 B2
(45) Date of Patent: Dec. 29, 2020

(54) TFT SUBSTRATE AND LIQUID CRYSTAL DISPLAY PANEL

(71) Applicant: SHENZHEN CHINA STAR OPTOELECTRONICS SEMICONDUCTOR DISPLAY TECHNOLOGY CO., LTD., Guangdong (CN)

(72) Inventor: Meng Wang, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 25 days.

(21) Appl. No.: 15/735,292

(22) PCT Filed: Jun. 22, 2017

(86) PCT No.: PCT/CN2017/089612
§ 371 (c)(1),
(2) Date: Dec. 11, 2017

(87) PCT Pub. No.: WO2018/218711
PCT Pub. Date: Dec. 6, 2018

(65) Prior Publication Data
US 2019/0113817 A1    Apr. 18, 2019

(30) Foreign Application Priority Data
May 27, 2017   (CN) .......................... 2017 1 0395248

(51) Int. Cl.
*G02F 1/1343*    (2006.01)
*G02F 1/1335*    (2006.01)
(Continued)

(52) U.S. Cl.
CPC ...... *G02F 1/136286* (2013.01); *G02F 1/1368* (2013.01); *G02F 1/13439* (2013.01);
(Continued)

(58) Field of Classification Search
CPC .. G02F 1/136; G02F 1/136286; G02F 1/1368; G02F 1/134309; G02F 1/133345;
(Continued)

(56) References Cited

U.S. PATENT DOCUMENTS

| | | | | |
|---|---|---|---|---|
| 7,038,740 B1 * | 5/2006 | Katsuya | ............ | G02F 1/133502 349/139 |
| 2010/0157204 A1 * | 6/2010 | Ichihashi | ............. | G02B 5/3016 349/75 |

(Continued)

FOREIGN PATENT DOCUMENTS

| CN | 102023430 A | 4/2011 |
|---|---|---|
| CN | 103715206 A | 4/2014 |

(Continued)

*Primary Examiner* — Thoi V Duong
(74) *Attorney, Agent, or Firm* — Hamre, Schumann, Mueller & Larson, P.C.

(57) ABSTRACT

A thin film transistor (TFT) substrate and a liquid crystal display panel are provided. The TFT substrate includes: a first substrate; a data line disposed on the first substrate; a first insulating layer disposed on the first substrate and the data line; a first common electrode disposed on the first insulating layer and above the data line to cover the data line; a second insulating layer disposed on the first common electrode and the first insulating layer; and a pixel electrode disposed on the second insulating layer.

9 Claims, 2 Drawing Sheets

(51) Int. Cl.
*G02F 1/1333* (2006.01)
*G02F 1/1362* (2006.01)
*H01L 27/12* (2006.01)
*G02F 1/1368* (2006.01)
*G02F 1/136* (2006.01)

(52) U.S. Cl.
CPC .. *G02F 1/133345* (2013.01); *G02F 1/133512* (2013.01); *G02F 1/133514* (2013.01); *G02F 1/134309* (2013.01); *H01L 27/124* (2013.01); *H01L 27/1214* (2013.01); *H01L 27/1218* (2013.01); *G02F 2001/13606* (2013.01); *G02F 2001/134381* (2013.01); *G02F 2201/121* (2013.01); *G02F 2201/123* (2013.01); *G02F 2201/40* (2013.01)

(58) Field of Classification Search
CPC ......... G02F 1/134363; G02F 1/136227; G02F 1/1335; G02F 1/133512; G02F 1/134336; G02F 1/133514; G02F 1/133707; G02F 1/136209; G02F 1/1362; G02F 1/1343; G02F 1/1333; G02F 2001/134318; G02F 2001/134372; G02F 2001/136218; G02F 2201/40; G02F 2201/50; G02F 2201/52; G02F 1/13439; G02F 2201/121; G02F 2201/123; G02F 2201/122; G02F 2001/133519; G02F 2001/133357; G02F 2001/1351; G02F 2001/13606; H01L 27/3244; H01L 27/3248; H01L 27/3258; H01L 27/3262; H01L 27/3276; H01L 28/60; H01L 51/5253; H01L 27/1214; H01L 27/124; H01L 27/1218; H01L 27/14621; H01L 29/78633; G09G 2300/0426; G02B 1/14
See application file for complete search history.

(56) References Cited

U.S. PATENT DOCUMENTS

| | | | | |
|---|---|---|---|---|
| 2012/0182490 | A1* | 7/2012 | Kim | G02F 1/134363 349/43 |
| 2013/0057816 | A1* | 3/2013 | Hirosawa | G02F 1/1337 349/123 |
| 2013/0329156 | A1* | 12/2013 | Hirosawa | G02F 1/134363 349/43 |
| 2014/0104522 | A1* | 4/2014 | Onda | G02F 1/134363 349/33 |
| 2014/0340603 | A1* | 11/2014 | Hu | G02F 1/136227 349/43 |
| 2015/0346564 | A1* | 12/2015 | Moriwaki | G02F 1/134309 349/43 |
| 2016/0266456 | A1 | 9/2016 | Park et al. | |
| 2016/0334680 | A1* | 11/2016 | Miyamoto | G02F 1/136286 |
| 2016/0370678 | A1 | 12/2016 | Ono | |
| 2017/0269425 | A1* | 9/2017 | Nakagawa | G02F 1/133345 |

FOREIGN PATENT DOCUMENTS

| | | |
|---|---|---|
| CN | 103728797 A | 4/2014 |
| CN | 104793413 A | 7/2015 |
| CN | 105116582 A | 12/2015 |
| WO | 2015132819 A1 | 9/2015 |

* cited by examiner

TFT SUBSTRATE AND LIQUID CRYSTAL DISPLAY PANEL

FIELD OF THE DISCLOSURE

The present disclosure relates to the field of manufacturing liquid crystal display panels, and more particularly to a thin film transistor (TFT) substrate and a liquid crystal display panel.

BACKGROUND

In contemporary times, there is a significant increase in using displays to communicate visible signals. For more widespread future use, development of the displays focuses on light weight, thin thickness, low energy consumption, low manufacturing cost, and better display quality.

For a vertical alignment (VA) mode of liquid crystal display panel, to avoid electric field influence of the data line on a liquid crystal layer disposed above the pixel electrode, a light-shielding structure is generally formed at the location near a crossed portion of the pixel electrode and the data line. Such design shields electric field of the data line from influencing the liquid crystal layer disposed above the pixel electrode, and thus preventing light leakage of pixels. However, such design would lower aperture ratio (AR) of the panel.

One conventional technique is thus provided to avoid influence of electrical field of the data line on liquid crystal panels by extending the pixel electrode over the data line, which ensures high AR. However, this will increase parasitic capacitance between the pixel electrode and the data line, raising the likelihood of signal cross-talk.

Therefore, there is a need to solve the problems encountered in the prior art.

SUMMARY OF THE DISCLOSURE

The object of the present disclosure is to provide a TFT substrate and a liquid crystal display panel.

To solve the above-mentioned problems, the present discloses provides the following schemes.

The present disclosure discloses a TFT substrate, comprising:
a first substrate;
a data line disposed on the first substrate;
a first insulating layer disposed on the first substrate and the data line;
a first common electrode disposed on the first insulating layer and above the data line to cover the data line;
a second insulating layer disposed on the first common electrode and the first insulating layer; and
a pixel electrode disposed on the second insulating layer.

In some embodiments, the pixel electrode extends above the first common electrode.

In some embodiments, the first common electrode is made of a transparent conductive metal or transparent conductive metal oxide.

In some embodiments, the first common electrode is made of indium tin oxide (ITO).

In some embodiments, the pixel electrode is made of a transparent conductive metal or transparent conductive metal oxide.

In some embodiments, the pixel electrode is made of ITO.

In some embodiments, the second insulating layer is made of silicon oxide and/or silicon nitride.

In some embodiments, the first insulating layer is made of silicon oxide and/or silicon nitride.

In some embodiments, the data line is made of a metal with high electrical conductivity.

In some embodiments, the first substrate is a glass substrate.

Further, the present disclosure provides a liquid crystal display panel, comprising: a liquid crystal layer, a color filter (CF) substrate disposed at one side of the liquid crystal layer, and a thin film transistor (TFT) substrate disposed at the other side of the liquid crystal layer;
wherein the TFT substrate comprises:
a first substrate;
a data line disposed on the first substrate;
a first insulating layer disposed on the first substrate and the data line;
a first common electrode disposed on the first insulating layer and above the data line to cover the data line;
a second insulating layer disposed on the first common electrode and the first insulating layer; and
a pixel electrode disposed on the second insulating layer.

In some embodiments, the pixel electrode extends above the first common electrode.

In some embodiments, the CF substrate comprises:
a second substrate;
a black matrix disposed on the second substrate to cover the first common electrode;
a color resist layer disposed on the second substrate, wherein the color resist layer comprises a plurality of color resist blocks arranged in a matrix, and the color resist blocks are isolated from one another by the black matrix;
a second common electrode disposed on the black matrix and the color resist layer.

In some embodiments, the second substrate is disposed at one side of the CF substrate which is relatively far from the liquid crystal layer.

In some embodiments, the black matrix is an opaque film made of metal oxide or a black photoresist film made of resin.

In some embodiments, the color resist layer comprises a plurality of red color resist blocks, a plurality of green color resist blocks, and a plurality of blue color resist blocks arranged in a matrix.

In some embodiments, the first common electrode is made of a transparent conductive metal or transparent conductive metal oxide.

In some embodiments, the pixel electrode is made of ITO.

In some embodiments, the data line is made of a metal with high electrical conductivity.

In some embodiments, the first insulating layer is made of silicon oxide and/or silicon nitride, and the second insulating layer is made of silicon oxide and/or silicon nitride.

Compared to the TFT substrate according to the prior art, the present disclosure provides a TFT substrate, comprising: a first substrate, a data line disposed on the first substrate, a first insulating layer disposed on the first substrate and the data line, a first common electrode disposed on the first insulating layer and above the data line to cover the data line, a second insulating layer disposed on the first common electrode and the first insulating layer, and a pixel electrode disposed on the second insulating layer. The embodiment This embodiment is to add a first common electrode above the data line, and to dispose an insulating layer between the first common electrode and the pixel electrode for shielding electrical field of the data line from influencing the liquid crystal layer and ensuring a higher aperture ratio (AR) of the panel. Moreover, the present disclosure prevents the parasitic capacitance generated between the data line and the pixel electrode, therefore the likelihood of signal cross-talking can be reduced, and thus the display quality of the liquid crystal panel is raised.

DETAILED DESCRIPTION

Figure 1:
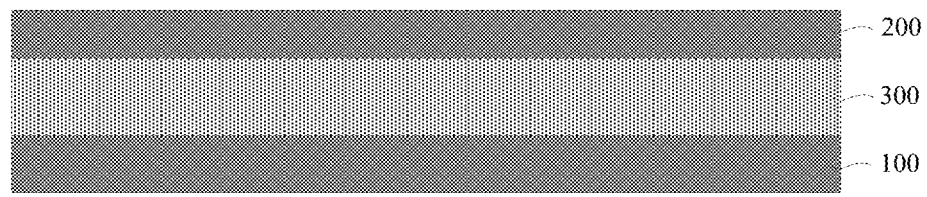
FIG. 1 is a schematic diagram showing a first structure of a liquid crystal display panel according to a preferred embodiment of the present disclosure.

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

In addition, the terms "first" and "second" are used for the purpose of description and should not be interpreted to indicate or imply relative importance or the number of technical features. Thus, the technical features defined by "first", "second" may explicitly or implicitly include one or more of the features. In the description of the present disclosure, the meaning of "plurality" is two or more, unless explicitly specifically limited. Further, the term "comprising" and any variations thereof are intended to cover non-exclusive inclusion.

Please refer to FIG. 1. FIG. 1 is a schematic diagram showing a first structure of a liquid crystal display panel according to a preferred embodiment of the present disclosure. As shown in FIG. 1, the liquid crystal display panel according to a preferred embodiment of the present disclosure includes a thin film transistor (TFT) substrate 100, a color filter (CF) substrate 200, and a liquid crystal (LC) layer 300. The TFT substrate 100 is disposed at one side of the LC layer 300, and the CF substrate 200 is disposed at the other side of the LC layer 300.

A backlight module is disposed on one side of the TFT substrate 100 which is relatively far from the LC layer 300. The TFT substrate 100 includes a TFT driver array. The TFT array is used to drive the liquid crystal molecules in the LC layer 300, so that the liquid crystal molecules can be twisted, and the light emitted from the backlight module can be allowed to pass through the LC crystal and to project through the CF substrate 200 so as to generate pictures and accomplish image display.

Figure 2:
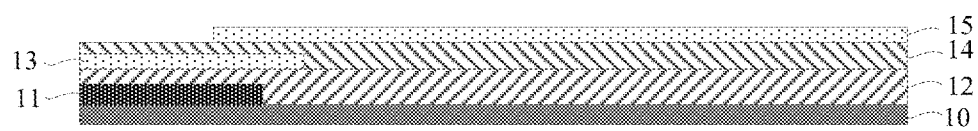
FIG. 2 is a schematic diagram showing a structure of the TFT substrate in the liquid crystal display panel of FIG. 1.
Figure 5:
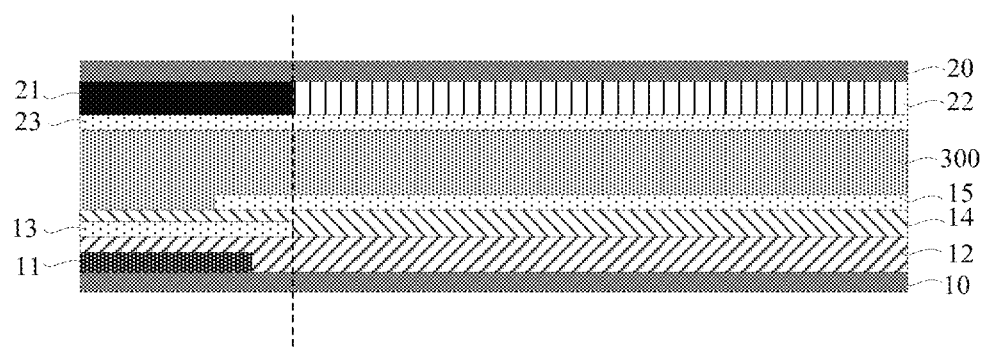
FIG. 5 is a schematic diagram showing a second structure of a liquid crystal display panel according to a preferred embodiment of the present disclosure.

Please refer to FIGS. 2 and 5, in which FIG. 2 is a schematic diagram showing a structure of the TFT substrate 100 in the liquid crystal display panel of FIG. 1, and FIG. 5 is a schematic diagram showing a second structure of a liquid crystal display panel according to a preferred embodiment of the present disclosure. As shown in FIG. 2, the TFT substrate includes a first substrate 10, a data line 11, a first insulating layer 12, a first common electrode 13, a second insulating layer 14, and a pixel electrode 15.

In particular, the data line 11 is disposed on the first substrate 10. The data line 11 can be made of a metal material, such as Mo/Cu, Al/Mo, MoTi/Cu, etc. The first substrate 10 can be a transparent rigid substrate or a transparent flexible substrate. For example, the first substrate 10 is made of glass or quartz, or includes a polyimide (PI) film.

The first insulating layer 12 is disposed on the first substrate 100 and the data line 11, and is transparent. In the embodiment of the present disclosure, the first insulating layer 12 can include either one layer or two layers. In the latter case, the first layer can made of one or more of the insulating materials selected from SiOx, SiNx, and AlOx, such as $Si_3N_4$, $SiO_2$, $Al_2O_3$, etc. And, the second layer is generally made of silicon nitride (i.e., SiNx), such as $Si_3N_4$.

Taking the first insulating layer 12 consisted of two layers as an example, the data line 11 and the first insulating layer 12 can be formed by a process that includes the following steps. First, an insulating material (such as $Si_3N_4$, $SiO_2$, $Al_2O_3$, etc.) is deposited on the substrate 10 to form an insulating material layer. After a photoresist layer with uniform thickness is coated on the insulating material layer, a portion of the insulating material is removed by photolithography and etching. The region where the portion of the insulating material is removed is used as an area where the data line is to be formed. Thereafter, a step of depositing a metal material is performed. With removal of photoresist and metal material deposed thereon, the metal material remained in the area where the data line is to be formed constitutes the data line 11. Finally, a step of blanket deposition of another insulating material (such as $Si_3N_4$) is performed by physical vapor deposition. As such, the data line 11 and the first insulating layer 12 are thus formed on the substrate 10.

The first common electrode 13 is disposed on the first insulating layer 12 and above the data line 11 to cover the data line 11. In other words, in the embodiment of the present disclosure, the first common electrode 13 covers the entire first insulating layer 12 located on the upper surface of the data line 11.

According to the embodiment of the present disclosure, the first common electrode 13 can be made of a transparent conductive metal or transparent conductive metal oxide or other transparent conductive materials. Preferably, the first common electrode 13 is made of indium tin oxide (ITO).

In particular, the first common electrode 13 can be formed on the first insulating layer 12 by physical vapor deposition, photolithography, and etching, etc.

The second insulating layer 14 is disposed on the first common electrode 13 and the first insulating layer 12, and is transparent. The second insulating layer 14 can be made of SiOx, SiNx, etc.

The pixel electrode 15 is disposed on the second insulating layer 14. According to the embodiment of the present disclosure, the pixel electrode 15 can be made of a transparent conductive metal or transparent conductive metal oxide or other transparent conductive materials. Preferably, the pixel electrode 15 is made of indium tin oxide (ITO).

In some embodiments, as shown in FIGS. 2 and 5, the pixel electrode 15 can extend above the first common electrode 13 in order to increase aperture ratio (AR). For example, under the circumstance where PPI>400, the aperture ratio (AR) can reach 30%-40%.

Please refer to FIG. 5. The liquid crystal layer 300 is disposed at one side of the TFT substrate 100 and is adjacent to the pixel electrode 15. The liquid crystal layer 300 covers the pixel electrode 15 and the second insulating layer 14.

Accordingly, the TFT substrate is manufactured in a way of ensuring a certain degree of aperture ratio (AR) without increasing parasitic capacitance between the pixel electrode and the data line, therefore avoiding the likelihood of signal cross-talking caused by the data line to the pixel electrode.

Figure 3:
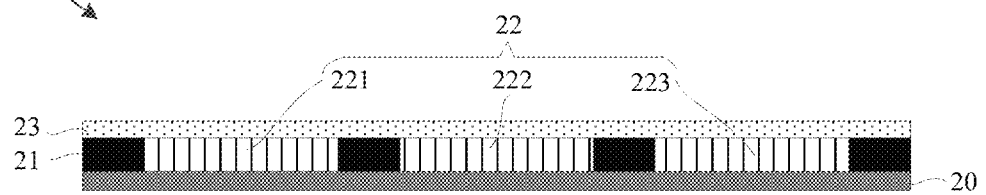
FIG. 3 is a schematic diagram showing a first structure of the CF substrate in the liquid crystal panel of FIG. 1.

Please refer to FIG. 3. FIG. 3 is a schematic diagram showing a first structure of the CF substrate in the liquid crystal panel of FIG. 1. As shown in FIG. 3, the CF substrate 300 includes a second substrate 20, a black matrix 21, a color resist layer 22, and a second common electrode 23.

The black matrix 21 is disposed on the second substrate 20. The second substrate 20 can be a transparent rigid substrate or a transparent flexible substrate. For example, the second substrate 20 is made of glass or quartz, or includes a polyimide (PI) film.

According to the embodiment of the present disclosure, the black matrix 21 is mainly used to prevent light leakage between the pixels and to increase contrast between colors. The black matrix 21 can be an opaque film (such as made of metal oxide ($Ti_4O_7$)), or a black photoresist film made of resin (such as mainly containing carbon black).

The color resist layer 22 is disposed on the second substrate 20. The color resist layer 22 includes a plurality of color resist blocks (including a plurality of red color resist blocks 221, a plurality of green color resist blocks 222, and a plurality of blue color resist blocks 223) arranged in a matrix, and the color resist blocks are isolated from one another by the black matrix 21. The black matrix 21 may avoid cross-talk between pixels of different colors, and thus increasing display quality.

The black matrix 21 can have a thickness greater than thickness of the color resist blocks 22, so as to further enhance avoidance of signal cross-talk between pixels of different colors.

The second common electrode 23 is disposed on the black matrix and the color resist layer. According to the embodiment of the present disclosure, the second common electrode 23 can be made of a transparent conductive metal or transparent conductive metal oxide or other transparent conductive materials. Preferably, the second common electrode 23 is made of indium tin oxide (ITO).

In some embodiments, the black matrix 21 can be made of metal with high electrical conductivity (e.g., Al, Ag, Cu, Mo, or Au) or metal alloy, and the black matrix 21 can be used an auxiliary electrode to increase conductive performance of the second common electrode 23. Thereby, twist of the liquid crystal molecules can be controlled more effectively, and the display quality of the liquid crystal panel is raised.

Please refer to FIG. 5. The liquid crystal layer 300 is disposed on one side of the CF substrate 200 and is adjacent to the second common electrode 23. In the embodiment of the present disclosure, the black matrix 21 covers the first common electrode 13.

Figure 4:
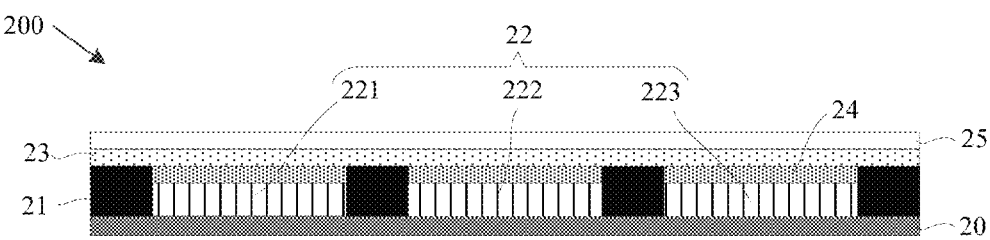
FIG. 4 is a schematic diagram showing a second structure of the CF substrate in the liquid crystal panel of FIG. 1.

In some embodiments, as shown in FIG. 4, a protective layer 24 is disposed on the color resist layer 22 to protect the color resist layer 22 and increase smoothness of surface. Generally, the protective layer 24 is made of a polymer material, such as epoxy or acrylic.

In some embodiments, an orientation film 25 is coated on the second common electrode 23 to control orientation directions and angles of the liquid crystal molecules more effectively.

It is learned from the above that the present disclosure provides a liquid crystal display panel, comprising a liquid crystal layer, a CF substrate disposed at one side of the liquid crystal layer, and a TFT substrate disposed at the other side of the liquid crystal layer. The TFT substrate comprises a first substrate, a data line disposed on the first substrate, a first insulating layer disposed on the first substrate and the data line, a first common electrode disposed on the first insulating layer and above the data line to cover the data line, a second insulating layer disposed on the first common electrode and the first insulating layer, and a pixel electrode disposed on the second insulating layer. This embodiment adds a first common electrode between the data line and the liquid crystal layer, and disposes an insulating layer between the first common electrode and the pixel electrode to shield electric field of the data line from influencing the liquid crystal layer and ensure a higher aperture ratio (AR) of the panel. Compared to the prior art, the present disclosure ensures a higher aperture ratio (AR) without increasing parasitic capacitance between the pixel electrode and the data line, therefore avoiding the likelihood of signal cross-talking caused by the data line to the pixel electrode, and thus increasing display quality of the liquid crystal panel.

In summary, while the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:
1. A liquid crystal display panel, comprising:
a liquid crystal layer;
a color filter (CF) substrate disposed at one side of the liquid crystal layer; and
a thin film transistor (TFT) substrate disposed at the other side of the liquid crystal layer,
wherein the TFT substrate comprises:
a first substrate;
a data line disposed on the first substrate;
a first insulating layer disposed on the first substrate and the data line;
a first common electrode disposed on the first insulating layer and above the data line to cover the data line;
a second insulating layer disposed on the first common electrode and the first insulating layer; and
a pixel electrode disposed on the second insulating layer and having a portion overlapped with the first common electrode and the data line,
wherein the CF substrate comprises:
a second substrate;
a black matrix, disposed on the second substrate to cover the first common electrode;
a color resist layer disposed on the second substrate, wherein the color resist layer comprises a plurality of color resist blocks arranged in a matrix, and the color resist blocks are isolated from one another by the black matrix;
a protective layer, disposed on the color resist layer; and
a second common electrode disposed on the black matrix and the color resist layer,
wherein the second common electrode contacts the black matrix and the protective layer, and
wherein a thickness of the black matrix equals to a sum of a thickness of the color resist layer and a thickness of the protective layer.

2. The liquid crystal display panel according to claim 1, wherein the pixel electrode extends above the first common electrode.

3. The liquid crystal display panel according to claim 1, wherein the second substrate is disposed at one side of the CF substrate relatively far from the liquid crystal layer.

4. The liquid crystal display panel according to claim 1, wherein the black matrix is an opaque film made of metal oxide or a black photoresist film made of resin.

5. The liquid crystal display panel according to claim 1, wherein the color resist layer comprises a plurality of red color resist blocks, a plurality of green color resist blocks, and a plurality of blue color resist blocks arranged in a matrix.

6. The liquid crystal display panel according to claim 1, wherein the first common electrode is made of a transparent conductive metal or transparent conductive metal oxide.

7. The liquid crystal display panel according to claim 6, wherein the pixel electrode is made of indium tin oxide (ITO).

8. The liquid crystal display panel according to claim 1, wherein the data line is made of a metal with high electrical conductivity.

9. The liquid crystal display panel according to claim 1, wherein the first insulating layer is made of silicon oxide and/or silicon nitride, and the second insulating layer is made of silicon oxide and/or silicon nitride.

\* \* \* \* \*